United States Patent
Vestal et al.

(10) Patent No.: US 12,354,897 B2
(45) Date of Patent: Jul. 8, 2025

(54) SUBSTRATE CONTAINER WITH DOOR GASKET

(71) Applicant: ENTEGRIS, INC., Billerica, MA (US)

(72) Inventors: Aaron Vestal, Colorado Springs, CO (US); Matthew A. Fuller, Colorado Springs, CO (US)

(73) Assignee: ENTEGRIS, INC., Billerica, MA (US)

( * ) Notice: Subject to any disclaimer, the term of this patent is extended or adjusted under 35 U.S.C. 154(b) by 23 days.

(21) Appl. No.: 18/195,258

(22) Filed: May 9, 2023

(65) Prior Publication Data

US 2023/0369087 A1 Nov. 16, 2023

Related U.S. Application Data

(60) Provisional application No. 63/340,438, filed on May 10, 2022.

(51) Int. Cl.
 *H01L 21/673* (2006.01)

(52) U.S. Cl.
 CPC .. *H01L 21/67376* (2013.01); *H01L 21/67366* (2013.01); *H01L 21/67386* (2013.01)

(58) Field of Classification Search
 CPC ......... H01L 21/67376; H01L 21/67366; H01L 21/67383; H01L 21/67386; H01L 21/67772; F16J 15/062
 USPC ........................................ 206/710–712, 832
 See application file for complete search history.

(56) References Cited

U.S. PATENT DOCUMENTS

| | | | |
|---|---|---|---|
| 5,112,065 A * | 5/1992 | Meyer | B60J 10/80 220/240 |
| 6,354,601 B1 * | 3/2002 | Krampotich | H01L 21/67376 220/795 |
| 6,848,578 B2 * | 2/2005 | Eggum | H01L 21/67376 206/454 |
| 8,292,081 B2 | 10/2012 | Sasaki | |
| 8,720,693 B2 * | 5/2014 | Nagashima | H01L 21/67376 206/711 |
| 8,899,443 B2 * | 12/2014 | Soibel | B65D 43/0233 220/795 |
| 9,426,912 B2 * | 8/2016 | Miki | F16J 15/104 |
| 9,520,310 B2 * | 12/2016 | Gregerson | B65D 85/30 |
| 12,068,183 B2 * | 8/2024 | Vestal | H01L 21/67376 |
| 2005/0230284 A1 | 10/2005 | Tieben et al. | |
| 2006/0249512 A1 * | 11/2006 | Ueda | H01L 21/67126 220/806 |
| 2009/0261533 A1 * | 10/2009 | Inoue | H01L 21/67376 277/648 |
| 2020/0051844 A1 * | 2/2020 | Bellet | H01L 21/67379 |
| 2020/0083077 A1 * | 3/2020 | Ogawa | B65D 85/30 |
| 2020/0185244 A1 * | 6/2020 | Ogawa | B65D 43/02 |

FOREIGN PATENT DOCUMENTS

TW M552185 U 11/2017

* cited by examiner

*Primary Examiner* — Chun Hoi Cheung

(57) ABSTRACT

Described are substrate containers that include an opening, a door to close the opening, and a gasket to seal the opening with the door placed over the opening.

19 Claims, 7 Drawing Sheets

SUBSTRATE CONTAINER WITH DOOR GASKET

FIELD OF THE INVENTION

The present disclosure relates to substrate containers that include an opening, a door to close the opening, and a gasket to seal the opening with the door placed over the opening.

BACKGROUND

Semiconductor wafers and microelectronic devices that are formed at their surfaces are prepared by a series of precise processing steps performed under extremely clean conditions. Between those processing steps, a wafer may be moved from one processing location to a different processing location, still using extremely clean conditions.

Semiconductor wafers are fragile, are easily damaged by physical contact or shock due to static electricity, and are highly sensitive to particle contamination.

During movement of wafers between processing steps, specialized containers are used to hold and transport multiple in-process wafers in a way that prevents damaging the wafers and that avoids introducing particle contamination to wafer surfaces. These specialized containers, sometimes referred to as "wafer carriers," are designed to safely move semiconductor wafers in a condition that prevents physical damage to the wafers and does not introduce contamination to the wafer surfaces. Regarding the latter, the materials and designs of wafer carrier structures are selected to not be a source of particle contamination.

A container typically includes a multi-sided container body (e.g., a "shell") that defines a container interior, an opening to the interior on one side of the container body, a removable door that is adapted to cover the opening, and a gasket that produces a seal between the door and the container body.

As microelectronic devices become smaller and the number of features per area of a wafer increases, the devices become more sensitive to contaminants. The size of contaminants that affect a microelectronic circuit continues to decreased, and is approaching the molecular scale. Consequently, ever-improving control of contamination is required during all phases of manufacturing, processing, transporting, and storage of semiconductor wafers.

Example wafer containers may be referred to as "SMIF pods" (Standard Mechanical Interface pods), "FOUPs" (Front Opening Unified Pods), or "FOSBs" (Front Opening Shipping Box). Sealing mechanisms for carriers have included relatively basic elastomeric gaskets that are situated between a surface of a door and a surface of a container body that surrounds an opening in the container. Typically, a portion of a gasket fits into a groove (sometimes referred to as a "gland") in a door around the perimeter of the door. The surface and the gasket faces the opening and contacts the container body at a surface that surrounds the opening. When the door is placed over the opening to cover the opening, the gasket is pressed between a surface of the door and the surface of the container that surrounds the opening.

SUMMARY

Gaskets for wafer carriers have identifiable deficiencies. Some of these are due to the specialized use of a gasket as a component of a wafer carrier. Others are a result of deterioration and wear that occur during use of a gasket in any context or application.

Most or all forms of sealing gaskets suffer from gradually deteriorated physical properties that occur over a period of use of the gasket. Some gaskets experience a gradual reduction in elasticity or flexural strength (resistance) over many cycles of flexing the gasket to form a seal. Reduced elasticity or flexural strength of the gasket causes a reduction in the effectiveness of the gasket to form a seal between a door and a container surface and to prevent gas or particle contamination between an interior and exterior of a container.

For gaskets that are designed for the specialized use of sealing a wafer container, a goal is to avoid generating particle contamination during use. Tiny particles of a material of a gasket may be generated by sloughing or shedding from a surface of the gasket, particularly upon elastic tensioning of the gasket or upon mechanical contact or movement between a surface of the gasket and a surface of a door or container.

Typical gaskets for wafer containers include one flexible portion secured to a surface of door, usually by being inserted into a channel or "gland," and a second flexible portion that contacts a surface of the container that surrounds a container opening. The second portion, a "sealing segment," is pressed between the door and a surface of the container to form a seal that prevents gas from passing between the container and the door. Examples are shown at U.S. Pat. No. 9,520,310 and Taiwanese patent document TW M 552185 U.

According to the invention, a gasket for sealing a wafer container includes a sealing segment that forms a seal between a first surface of the container and a second surface of the container. One surface is a surface of the door and one surface is a surface that surrounds an opening in the wafer container. The first surface (which may be the surface of the door or the surface of the container body that surrounds the opening) contains a recess. The sealing segment includes a surface that contacts the recess. The sealing segment includes a second surface that contacts the second surface. With the door placed to cover the opening, the sealing segment contacts the first surface, the second surface, and is pressed between the first and second surfaces to form a seal between the first surface and the second surface. In example gaskets and containers, the sealing segment is compressed and may experience a reduction in length between a location at which the sealing segment contacts the first surface and a location at which the sealing segment contacts the second surface.

In one aspect, the invention relates to a wafer container that includes: a container body comprising an opening and an opening-perimeter surface extending about the opening; a door adapted to cover the opening and comprising a door-perimeter surface adapted to oppose the opening-perimeter surface; a flat portion and a recess that both extend about the opening-perimeter surface or the door-perimeter surface; and a gasket. The gasket includes: a gasket body, which contacts the flat portion; and a sealing segment attached to the gasket body. The sealing segment includes a heel and a tip. With the door positioned to cover the opening and press the sealing segment between the opening-perimeter surface and the door-perimeter surface, the heel contacts a surface of the recess.

In another aspect, the invention relates to method for closing a door of a wafer container. The wafer container includes: an opening and an opening-perimeter surface extending about the opening; a door adapted to cover the opening and comprising a door-perimeter surface adapted to oppose the opening-perimeter surface; a flat portion and a recess that both extend about the opening-perimeter surface or the door-perimeter surface; and a gasket. The gasket includes: a gasket body contacting the flat portion; and a sealing segment attached to the gasket body. The sealing segment includes a heel and a tip. The method includes placing the door over the opening to press the gasket between the heel and the tip and seal the opening, with the heel contacting a surface of the recess.

All figures are schematic and not to scale.

DETAILED DESCRIPTION

The following describes wafer containers that include a container body that has an interior and an opening to access the interior, a door to cover the opening, and a gasket that forms a seal between a surface of the container body and a surface of the door when the door covers the opening.

A wafer container includes a multi-sided container body (sometimes referred to as a "shell") that defines a container interior that is adapted to contain and support one or more semiconductor wafers. The body includes an opening ("container opening") that allows access to the container interior on one side of the container body. The container includes a door that is adapted to cover the opening.

During use, the door is used to cover the container body opening and enclose and seal the interior from an exterior, at the opening. To form the seal, a gasket is included between a surface of the door at the door perimeter and a surface of the container body that surrounds the opening. When the door is placed to cover the opening, a surface at the perimeter of the door (the "door-perimeter surface") contacts the gasket on one side of the gasket. An opposed side of the gasket contacts a surface of the container body that surrounds the container opening along the perimeter of the opening (an "opening-perimeter surface"). With the door covering the opening, the gasket is pressed between the door-perimeter surface and the opening-perimeter surface to form a seal between the door and the container at the opening.

Generally, the seal is formed between two surfaces of the container, which may be referred to herein as a "first surface" and a "second surface." One of these two surfaces of the door-perimeter opening. The other of these two surfaces is the opening-perimeter surface. The gasket is secured to one of these two surfaces, which may either be the door-perimeter surface or the opening-perimeter surface. The surface to which the gasket is attached may be referred to as the "first surface." The "second" surface is the door-perimeter surface or the opening-perimeter surface, whichever is not the "first" surface.

The surface to which the gasket is attached, i.e., the "first surface" also contains a recess. The recess is a depression in the first surface that extends along an entire length of a perimeter of the surface, i.e., an outer perimeter of a door or a perimeter of the surface of the container body that surrounds the opening. The recess is a small depression or channel formed along a perimeter of the first surface that is sized to allow a portion of a sealing segment of the gasket to become located within the recess during use of the gasket to seal an opening of a container, and to allow a surface of the sealing segment of the gasket to contact a surface of the recess.

Figure 2A:
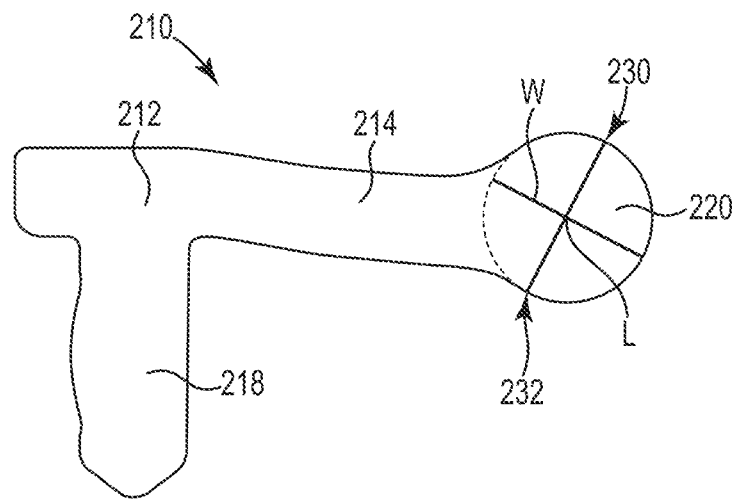
FIGS. 2A, 2B, and 2C show cross-sectional features of gaskets as described.
Figure 2B:
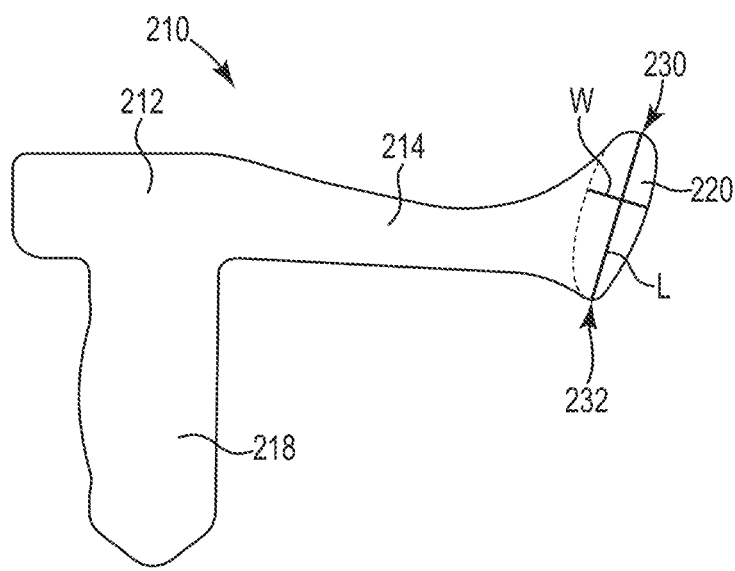

An example recess is shown at FIGS. 2A and 2B. As illustrated, an example first surface includes a "flat" portion 208 that is parallel to an "x" direction, i.e., parallel to a plane of the opening of the container and parallel to a plane of the door when the door is located to cover the opening. The gasket includes a body 212 that has a portion located at (against) the flat portion 208 of the first surface. The gasket also includes a sealing segment 220 that is located near (adjacent to) recess 208.

The recess can be any shape, with an example recess 208 (as shown at FIGS. 2A and 2B) having a form that begins at flat portion 208 and gradually increases in depth along the x-direction, as distance in the x direction from flat portion 208 increases. An example recess may be in the form of a non-symmetrical (in cross-section) "well" or "channel" formed in the first surface that has a variable depth, with the depth increasing gradually. An angle of a surface of a recess relative to the flat portion (angle "z" as shown at FIG. 2A, which is a function of the rate of change in depth of the recess, measured from the start of the channel to a maximum depth) may be any useful angle, such as an angle in a range from 10 to 80 degrees, e.g., from 20 to 70 degrees or from 30 to 60 degrees. A recess may have any maximum depth relative to the flat portion of the first surface, and a minimum depth that is effective to allow the sealing segment of the gasket to be effective as described. A depth of the recess may be at least 0.3 millimeters, e.g., at least 0.5, e.g., from 0.5 to 5 millimeter, or from 1 to 3 millimeters.

The gasket includes a gasket body that is attached to the first surface and a sealing segment that is attached to the gasket body. The body includes a flat portion that contacts a flat portion of the first surface. The body may be attached to the first surface by any useful structure or mechanism. In example gaskets, the gasket body includes the flat portion and is attached to an attachment segment that connected to the flat portion of the gasket body. The attachment segment of the gasket fits snugly into an attachment channel (or "gland") formed in the first surface to frictionally secure the gasket to the first surface.

When viewed in cross-section along a length of the gasket, the attachment segment of the gasket is separated from the sealing segment of the gasket by the flat segment of the gasket body, which, generally, may be any flat segment that effectively connects the attachment segment and the sealing segment. When viewed in cross-section along a length of the gasket attached to a first surface, the attachment channel of the first surface is separated from the recess of the first surface by the flat portion of the first surface. The attachment channel is different from the recess, but also extends about the entire length of the perimeter of the first surface alongside of the recess, e.g., along the entire perimeter of a surface of the door that faces the container, or along the entire perimeter of a surface of the container body that surrounds the container opening.

The sealing segment of the gasket includes two surfaces that are adapted to contact the first and second surfaces of the container to form a seal between the first and second surfaces of the container, i.e., to form a seal between the door-perimeter surface and the opening-perimeter surface. One surface of the gasket is a "heel" of the sealing segment, which contacts the first surface of the container, and the second surface of the gasket is a tip of the sealing segment, which contacts the second surface of the container. The sealing segment of the gasket connects to the gasket body near a "heel" portion of the sealing segment. From the heel, the sealing segment extends in a direction that is away from the gasket body and that is away from the first surface of the container, along a length that ends at a "tip" of the sealing segment of the gasket.

During use of the gasket to form a seal between a first surface and a second surface of a container, a surface of the heel portion of the gasket contacts a surface of the recess of the first surface of the container. Also, the surface at the tip of the sealing segment contacts the second surface of the container. The sealing segment is pressed and then held between the first surface of the container and the second surface of the container, and is placed under a set of forces that cause the sealing segment or a portion of the sealing segment to experience: compression, movement relative to one or both of the first and second surfaces, tension or extension, or a combination of these. For example, in preferred examples of a gasket, the sealing segment is compressed along a line that extends between the heel of the sealing segment, at a point of contact with the surface of the recess, and a tip of the sealing segment at a point of contact with the second surface of the container.

Also during use, as the door covers the container opening and the sealing segment tip contacts the second surface, the tip slides along the second surface. The tip is caused to move along two directional components: in a direction toward the first surface, and in a direction away from the body of the gasket.

Figure 1A:
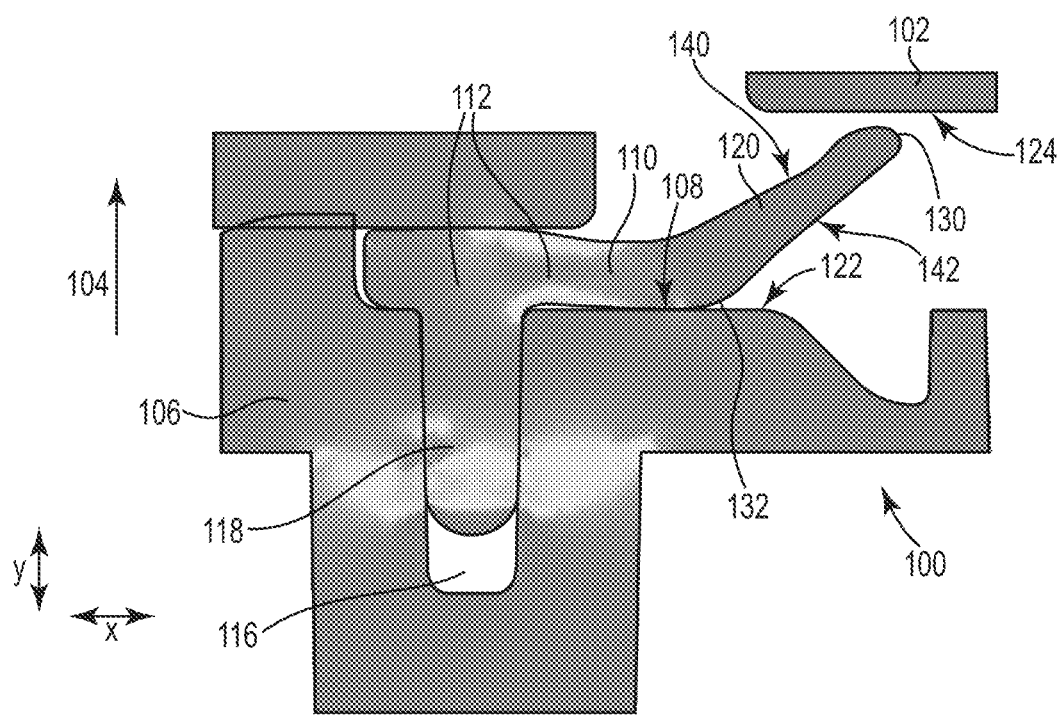
FIGS. 1A and 1B show cross-sectional views along a length of a prior art gasket and a wafer container door.
Figure 1B:
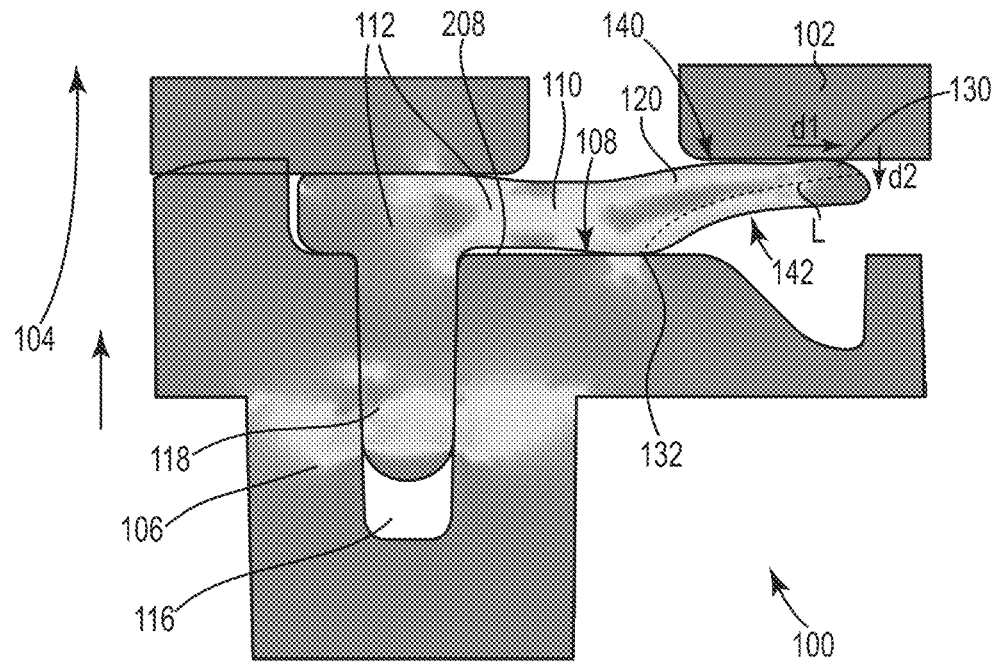

At least some previous gasket designs include a sealing segment that operates in large part by the sealing segment experiencing flexing and tension (as opposed to compression) when the sealing segment is pressed between a first surface and a second surface of a wafer container, when the door is placed over an opening in the container to cover the opening. FIGS. 1A and 1B show an example of a previous gasket that includes an elongate "wiper"-style sealing segment. As illustrated, wafer container 100 includes container body 102 that is adjacent to opening 104, and door 106. Door 106 is adapted to cover opening 104 by pressing gasket 110 between surface 122 of door 106 and surface 124 of container body 102, particularly by pressing sealing segment 120 of gasket 110 between these two surfaces. Sealing segment 120 of gasket 110 includes a surface at tip 130 that contacts surface 124, and a surface at heel 132 that contacts surface 122. Attachment segment 118 is located within channel ("gland") 116, to secure gasket 110 to door 106.

As shown at FIG. 1A, gasket 110 includes body 112 that is secured to door 106, including a portion that is adjacent to flat portion 108. Gasket 110 also includes sealing segment 120 connected to an end of body 112, with sealing segment 120 in a position to contact both surface 122 of door 106 (with heel surface 132) and surface 124 of wafer container body 102 (with tip 130). When door 106 is spaced from container body 102, sealing segment 120 is un-flexed. See FIG. 1A. No forces act on sealing segment 120.

Referring to FIG. 1B, door 106 is moved in the direction of container body 102, when door 106 is placed over opening 104 to seal the interior of container 100. Surface 130 contacts surface 124 and tip 130 moves laterally in a "x" direction, in contact with surface 124, in a direction and distance d1. Tip 130 also moves in a depth direction (in an "y" direction) along the direction of movement of door 106 toward body 102, a distance and direction d2. Contact and movement between tip 130 and surface 124 create the potential of particulate debris to be generated at tip 130, which can become dispersed within the interior of wafer container 100 and exposed to wafers within the interior.

With sealing segment 120 held between first surface 132 and second surface of 124, sealing segment 120 experiences a set of forces applied from the first and second surfaces. For example, surface 140 of sealing segment 120 may experience tension due to extension, and a portion of surface 142 may experience compression. The tension along surface 140 stretches the surface of the length of sealing segment 120 along surface 140 and creates the potential of particulate debris to be generated at surface 140, which can become dispersed within the interior of wafer container 100. The interior of sealing segment 120 between tip 130 and heel 132, along line L, does not experience a significant amount of compression, although some amount of compression may be present, particularly near the heel 132 at contact with flat portion 108. Cycling of the door to seal and un-seal the container by flexing gasket sealing segment 120 creates an amount of strain on sealing segment 120, which when applied and released repeatedly causes a relaxation of the force needed to flex gasket sealing segment 120. The force of the seal of sealing segment 120 decreases over cycles of opening and closing door 106.

In contrast, during use of a sealing segment of a gasket of the present description, forces that are applied to the sealing segment include a significant amount of compression along the length of the sealing segment between a tip and a heel, at the interior portion of the sealing segment, including a greater amount of compression than is present along line L of sealing segment 120 of FIG. 1B. Preferred sealing segments are compressed at locations along a line that extends between the heel of the sealing segment at a point of contact with the surface of the recess, and a tip of the sealing segment at a point of contact with the second surface of the container.

Figure 2C:
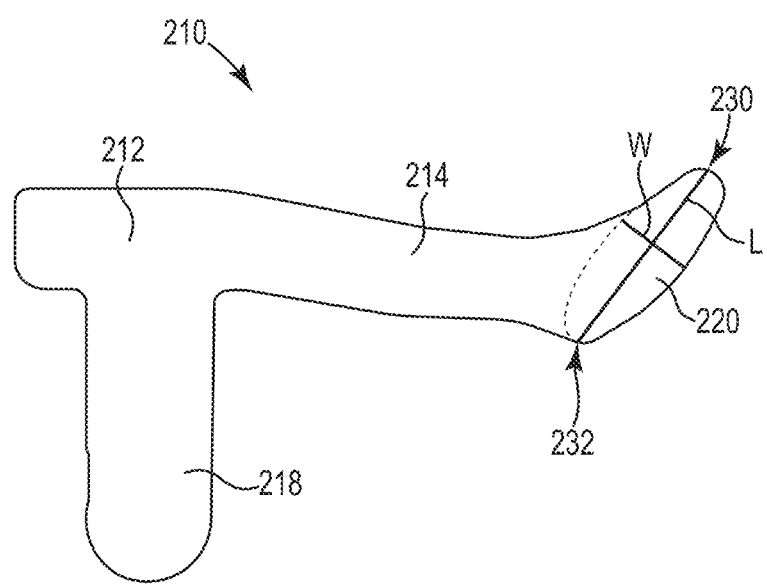

Examples gasket designs are shown in cross-section at FIGS. 2A, 2B, and 2C. Each gasket 210 includes body 212, sealing segment 220, and attachment segment 218. Attachment segment 218 is adapted to fit within a channel ("gland") of a surface of a wafer container such as a channel of a door, with the channel being adjacent to a recess also at the surface, as described. Sealing segment 220 is connected to an end of body 212 that is opposite from attachment segment 218. Body 212 includes elongate portion 214 between attachment segment 218 and sealing segment 220, with the length of elongate portion 214 being sufficient to position a portion of sealing segment 218 within the recess while attachment segment 218 is held in the channel. When gasket 210 is installed at the surface with attachment segment 218 held within the channel, sealing segment 220 is located at a position to contact a surface of the recess.

Sealing segment 220 of each gasket 210 includes heel 232, tip 230, and a length L between heel 232 and tip 230. The cross-sectional shape of sealing segment 220 can be any shape that will allow the sealing segment to function as described herein. Example sealing segment 220 of gasket 210 of FIG. 2A is substantially round or bulbous, and includes heel 232 adapted to contact a recess of a first surface of a wafer container, and tip 230 at a location to contact a second surface of the wafer container. Example sealing segment 220 of each gasket 210 of FIGS. 2B and 2C is elongate, also including heel 232 adapted to contact a recess of a first surface of a wafer container, and tip 230 at a location to contact a second surface of the wafer container.

Figure 3A:
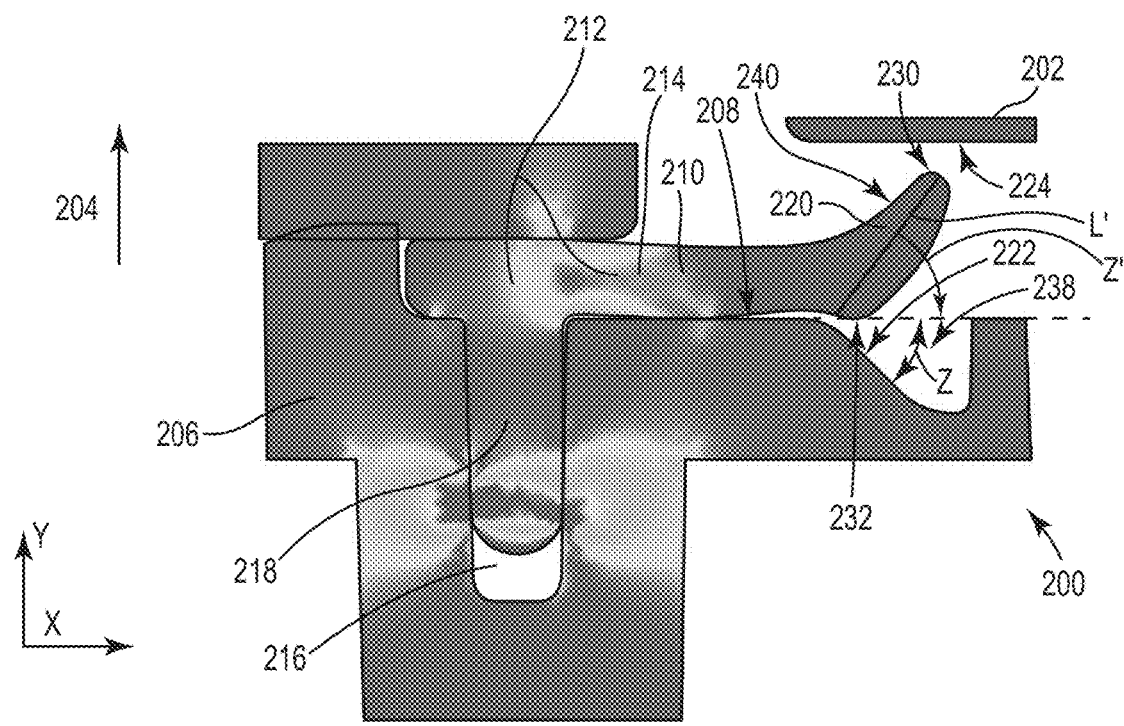
FIGS. 3A and 3B show cross-sectional views along a length of a gasket and a wafer container door of the present description.
Figure 3B:
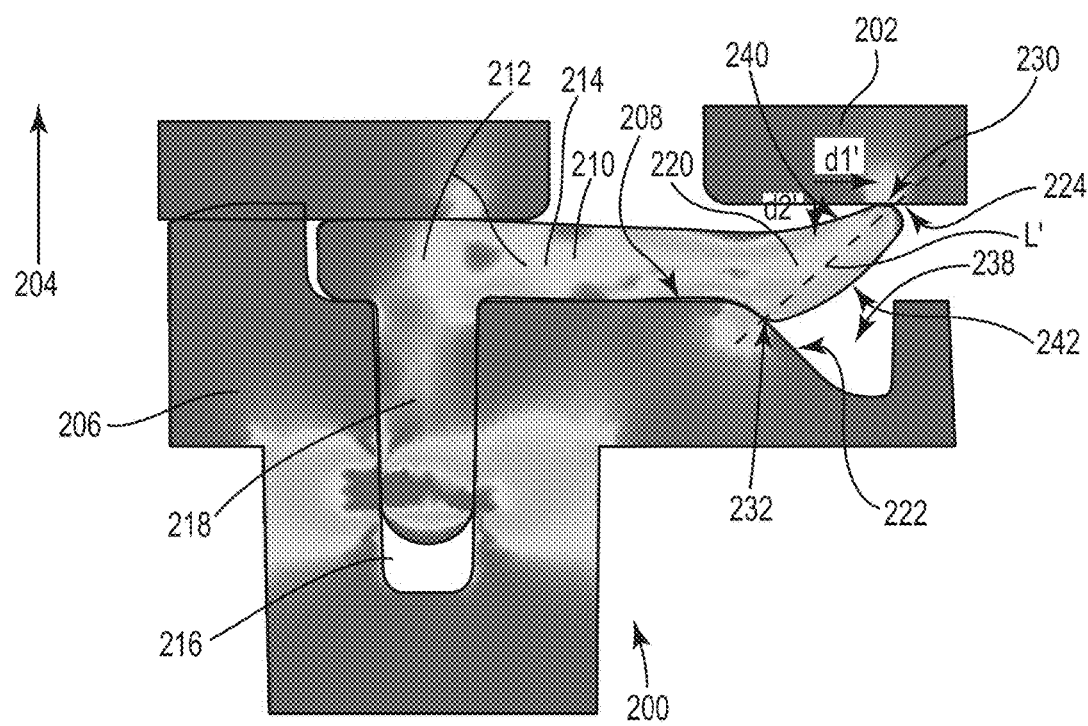

FIGS. 3A and 3B show an example of a gasket as described. Wafer container 200 includes container body 202 that is adjacent to opening 204, and door 206. Door 206 is adapted to cover opening 204 by pressing gasket 210 between surface 222 of recess 238 of door 206, and surface 224 of container body 202, particularly by pressing sealing segment 220 of gasket 210 between these surfaces of body 202 and door 206. Sealing segment 220 includes a surface at tip 230 that contacts surface 224 and a surface at heel 232 that contacts surface 222 of recess 238. Attachment segment 218 is located within channel ("gland") 216, to secure gasket 210 to door 206.

As shown at FIG. 3A, gasket 210 includes body 212 that is secured to door 206 (in this example the door is the "first surface" of the container), including an elongate portion 214 that is adjacent to flat portion 208. Gasket 210 also includes sealing segment 220 connected to an end of body 212 and located in a position to contact both surface 222 within recess 238 of door 206, and surface 224 of wafer container body 202.

When door 206 is spaced away from container body 202, sealing segment 220 is un-flexed. No forces are acting on sealing segment 220. An example of a length L' between tip 230 and heel 232, measured with sealing segment 220 un-flexed as in FIG. 3A, may be in a range from 2 to 5 centimeters, e.g., from 3 to 4 centimeters.

Referring to FIG. 3B, door 206 is moved in the direction of container body 202 when door 206 is placed over opening 204 to seal the interior of container 200. A surface of tip 230 contacts surface 224, and tip 230 moves laterally in a "x" direction, in contact with surface 224, in a direction and distance d1'. Tip 230 also moves in a depth direction (in a "y" direction) along the direction of movement of door 206, toward door 206, a distance and direction d2'.

In comparison to sealing segment 120 of gasket 110 (FIGS. 1A and 1B), sealing segment 220 of gasket 210 is of a shorter length (L') between a relevant heel surface 132, 232 at a location of contact with surface 122, 222, and surface of a tip 130, 230 at a location of contact with surface 124, 224. As illustrated, distance d1' can be less than distance d1, and distance d2' can be less than distance d2'. With distance d1' being less than distance d1, and distance d2' being less than distance d2', a shorter distance of contacting movement between tip 230 and surface 224 creates a reduced potential of particulate debris to be generated frictionally at tip 230, compared to tip 130 of gasket 110.

According to useful or preferred example sealing segments of the present invention, when the sealing segment is pressed between a door and a surface of a container body to form a useful seal, the distance d1' (distance of movement of tip 230 in the x direction) may be less than 1 millimeter, e.g., less than 0.8 millimeters. Also according to useful or preferred example sealing segments, when pressed between a door and a surface of a container body to form a useful seal, the distance d2' (the distance of movement of tip 230 in the y direction) may be less than 3 millimeter, e.g., less than 2 millimeters.

As further comparison, sealing segment 220 of gasket 210, when pressed between surfaces 230 and 232, experiences a greater degree of compression along length L' compared to the level of compression force present along length L of sealing segment 120. With sealing segment 220 pressed and held between first surface 222 and second surface of 224, sealing segment 220 experiences a set of forces applied from the first and second surfaces. Surface 240 of sealing segment 220 may experience tension due to extension, and surface 242 may experience compression. The interior of sealing segment 220, between tip 230 and heel 232, along line L', is compressed along a substantial portion of the length of L'. An angle Z between flat portion 208 and line L' is at least 30 degrees, e.g., at least 40 degrees, indicating a compressive force along line L'.

As such, a length L' between tip 230 and heel 232, measured with sealing segment 220 is in a non-compressed (relaxed) condition in FIG. 3A, is greater than a length L' between tip 230 and heel 232 measured with sealing segment 220 pressed between surface 222 and 224 as in FIG. 2B. The difference in length between the compressed state (FIG. 3B) and the non-compressed state (FIG. 3A) may be at least 0.1, 0.2, or 0.3 mm (millimeter), e.g. a difference in a range from 0.1 to 0.5 millimeter. In contrast, the length of sealing segment 120 of FIGS. 1A and 1B is not comparably reduced when sealing segment 120 is pressed between a first surface and a second surface (as shown at FIG. 1B), compared to a length of relaxed segment 120 (shown at FIG. 1A).

The design of sealing segment 220, compared to sealing segment 120, can result in improved performance of sealing segment 220 relative to sealing segment 120. Sealing segment 220 may exhibit more consistent closure force over many door closing and opening cycles, and may exhibit reduced dimensional change over many door closing and opening cycles, or both.

Figure 4:
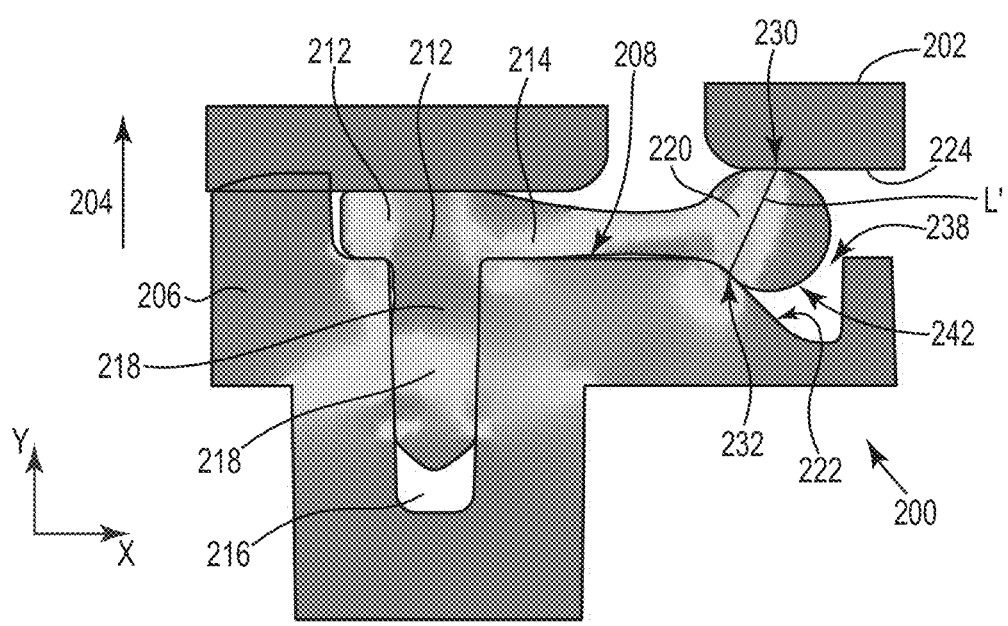
FIG. 4 shows a cross-sectional view along a length of a gasket and a wafer container door of the present description.

FIG. 4 shows an additional example of a gasket 210 that includes body 212 that is secured to door 206 (in this example the door is the "first surface" of the container), including an elongate portion 214 that is adjacent to flat portion 208. Other features and functions of gasket 210 of FIG. 4 are similar to features and functions of gasket 210 of FIGS. 3A and 3B, with similar numerical designations. Gasket 210 also includes bulbous (in cross section) sealing segment 220 connected to an end of body 212 and located in a position to contact both surface 222 within recess 238 of door 206, and surface 224 of wafer container body 202.

When door 206 is spaced away from container body 202, sealing segment 220 is un-flexed. With door 206 placed over opening 204 as in FIG. 4, to seal the interior of container 200, a surface of tip 230 contacts surface 224, and tip 230 moves laterally in a "x" direction, in contact with surface 224, in a direction and distance d1' relative to the un-flexed position. Tip 230 also moves in a depth direction (in a "y" direction) along the direction of movement of door 206, toward door 206, a distance and direction d2' relative to an un-flexed position. With sealing segment 220 pressed and held between first surface 222 and second surface of 224, sealing segment 220 experiences a set of forces applied from the first and second surfaces. Surface 240 of sealing segment 220 may experience tension due to extension, and surface 242 may experience compression. The interior of sealing segment 220, between tip 230 and heel 232, along line L', is compressed along a substantial portion of the length of L'.

Figure 5:
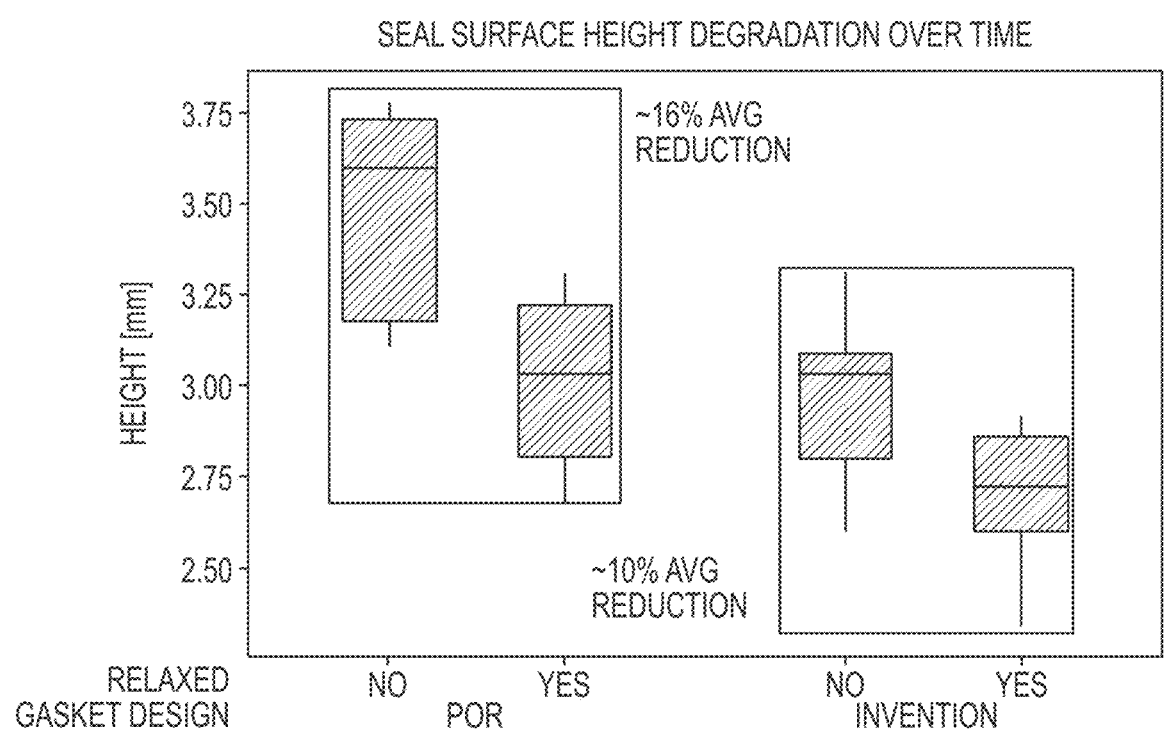
FIG. 5 shows performance data of an example wafer container and gasket.

FIG. 5 has data that compares a gasket design that has a sealing segment that is substantially deflected and not substantially compressed along the interior of the sealing segment (e.g., as shown at FIGS. 1A and 1B), denoted "POR," to a sealing segment of the present invention that is less deflected and experiences greater amount of compression, a length reduction, or both, along the interior of the sealing segment (e.g., as shown at FIGS. 3A and 3B).

The table of FIG. 5 shows data of dimensional degradation over time of a sealing segment when a sealing segment of a gasket is compressed continuously in a door of a container for two weeks. For a control seal (POR) and an inventive seal, a height of the sealing segment was measured relative to a door-perimeter surface, using a height gauge, of gasket initially installed in the door. The door was placed over an opening of a container, and the sealing segment became pressed between the door-perimeter surface and an opening-perimeter surface of the container. After two weeks of being pressed between the surfaces, the height of the sealing segment was again measured. As shown at FIG. 5, the inventive sealing segment experienced an approximate 10 percent reduction in height over 2 weeks, while the POR sealing segment experienced an approximate 16 percent reduction in height over the same period.

Figure 6:
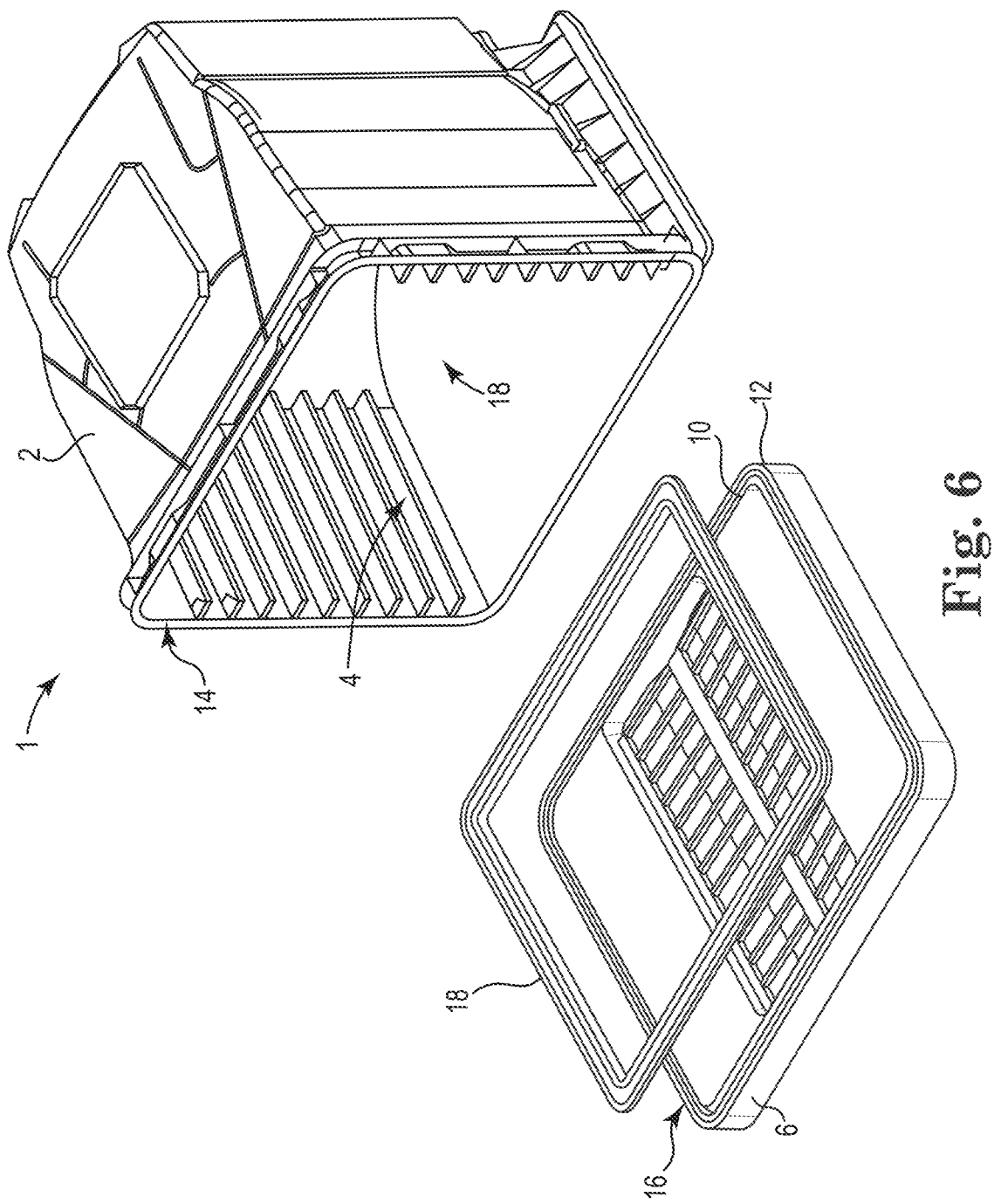
FIG. 6 shows an exploded view of an example wafer container as described.

FIG. 6 shows an exploded view of a wafer container as described. Wafer container 1 includes container body (e.g. "shell") 2, interior 18, opening 4, and opening-perimeter surface 14. Wafer container 1 also includes door 6 having door-perimeter surface 16 extending along a perimeter of door 6, recess 16 extending along a perimeter of door 6, and channel 10 extending along a perimeter of door 6. Gasket 8 is held in place by an attachment segment (not specifically indicated) of gasket 8, which fits into channel 10.

Gasket 8 can be used to seal opening of container body 2 when door 6 is placed over opening 4. Gasket 8 is shown as being attached to a perimeter of door 6, but gasket 8 may alternately be attached to the surface of body 2 that surrounds opening 4.

Wafer container 1 can be used for transporting, containing, or storing semiconductor wafers are that are being processed by a series of processing steps (i.e., wafers that are "in-process"), between steps of the series. Wafer container 1, as illustrated, is a front opening container, for example, a front opening unified pod (FOUP).

Container body 2 defines interior 18 within wafer container 1, with open end 4 provided on one side of container body 2 to allow access to the interior. Open end 4 allows multiple wafers to be placed inside and removed from the interior of container body 2.

Door 6 can be used to cover opening 4. When opening 4 is covered by door 6, a seal can be formed using gasket 8 between the door and the container. The sealed interior of wafer container 1 is a microenvironment that is protected from contaminants that are exterior to wafer container 1.

Gasket 8 is a gasket as described herein, e.g., gasket 210 as shown at FIGS. 3A and 3B. When door 6 covers opening 4, gasket 8 forms a seal between a surface of container body 2 that surrounds opening 4 (opening-perimeter surface 16), and a surface of door 6 (door-perimeter surface 14). One surface of a sealing segment of gasket 8, i.e., a heel, contacts a surface of recess 12 of door-perimeter surface 16. A surface at the tip of the sealing segment contacts opening-perimeter surface 14. When held between door-perimeter surface 16 and opening-perimeter surface 14, the sealing segment is compressed along a length between the tip and the heel, and the length of the sealing segment between the tip and the heel is reduced.

Gasket 8 can be made of any suitable material for forming the seal, such as a polymer material. Example materials for gasket 8 include natural and synthetic elastomeric materials, including polymers, particularly thermoplastic elastomers that have a Shore A hardness of 50-80 durometer.

As shown at FIG. 6, door 6 includes channel (or "gland" 10) formed in door-perimeter surface 16, which faces container body 2 and opening-perimeter surface 14 when door 6 and container 2 are assembled to close opening 4. Channel 10 is configured to retain gasket 8. Channel 10 is a groove configured to accommodate a projection or "attachment segment" of gasket 8. While channel 10 is shown as being located on door 6, it is understood that a channel can be in any suitable position for retaining gasket 8 such that gasket 8 can form a seal between door 6 and container body 2, for example at the perimeter of opening 4.

Example gaskets of the present description are useful to form a seal between a door and an opening of a wafer container that is effective for commercial use of the wafer container. The effectiveness of this type of a seal, formed by an elastomeric gasket, is sometimes referred to as "vacuum conductance," and has units of flow rate per atmosphere, e.g., volume per time per pressure differential, such as liters per second per atmosphere. Example gaskets of the present description can be effective to form a seal that has a conductance of not greater than 0.2 liters per second per atmosphere (L/s/atmosphere), or not greater than 0.1 liters per second per atmosphere.

The gasket, during use, will produce a force when the gasket is pressed between the door and the container body. This force can be referred to as a "sealing force." Equipment and methods that are useful for measuring a sealing force are commercially known. Useful equipment includes devices known as "loadport," which are analytical devices that remove and replace a door while measuring associated forces. The door can be closed to different positions relative to the container body. At different positions, different forces are placed on the gasket and different "sealing forces" result. By a method that closes a door to a location of 165.5 millimeters from a facial datum plane (center of a 300 mm wafer) contained in a wafer container, a gasket as described may produce a sealing force in a range from 15 to 20 pounds (force).

The invention claimed is:

1. A wafer container comprising:
   a container body comprising an opening and an opening-perimeter surface extending about the opening,
   a door adapted to cover the opening and comprising a door-perimeter surface adapted to oppose the opening-perimeter surface,
   a flat portion and a recess that both extend about the door-perimeter surface, and
   a gasket comprising:
      a gasket body, which contacts the flat portion, and
      a sealing segment attached to the gasket body, the sealing segment comprising a heel and a tip,
   wherein with the door positioned to cover the opening and press the sealing segment between the opening-perimeter surface and the door-perimeter surface, the heel contacts a surface of the recess and the tip contacts a surface of the container body.

2. The wafer container of claim 1 wherein the door-perimeter surface comprises the recess, and with the door positioned to seal the opening:
   the heel contacts the surface of the recess at a heel contact area,
   the tip contacts the opening-perimeter surface at a tip contact area, and
   the sealing segment is compressed between the heel contact area and the tip contact area.

3. The wafer container of claim 1 wherein:
   the door-perimeter surface comprises a channel adjacent to the recess,
   the gasket comprises an insertion segment connected to the body segment, and
   the insertion segment is located within the channel to secure the gasket to the door-perimeter surface.

4. The wafer container of claim 1, wherein when the door seals the opening, a conductance through the door joint is less than 0.2 liters/s/atmosphere.

5. The wafer container of claim 1 wherein the gasket comprises thermoplastic elastomer having a Shore A hardness of from 50 to 80 durometer.

6. The wafer container of claim 1, wherein the gasket has a sealing force in a range from 15 to 20 pounds force.

7. The wafer container of claim 1, wherein the sealing segment has a length between the heel and the tip in a range from 3 to 4 cm.

8. The wafer container of claim 1, wherein the sealing segment is bulbous.

9. The wafer container of claim 1, wherein the sealing segment is elongate.

10. A method for closing a door of a wafer container, the wafer container comprising:
   an opening of a container body and an opening-perimeter surface extending about the opening,
   a door adapted to cover the opening and comprising a door-perimeter surface adapted to oppose the opening-perimeter surface,
   a flat portion and a recess that both extend about the door-perimeter surface, and
   a gasket comprising:
      a gasket body, which contacts the flat portion, and
      a sealing segment attached to the gasket body, the sealing segment comprising a heel and a tip,
the method comprising placing the door over the opening to press the gasket between the heel and the tip and seal the opening, with the heel contacting a surface of the recess and the tip contacting a surface of the container body.

11. The method of claim 10, wherein the sealing segment has a length between the heel and the tip in a range from 3 to 4 cm.

12. The method of claim 10, wherein when the gasket is pressed between the heel and the tip, a length from the heel to the tip is reduced.

13. The method of claim 10, wherein the sealing segment is bulbous.

14. The method of claim 10, wherein the sealing segment is elongate.

15. The method of claim 10, wherein:
   the door-perimeter surface comprises the recess,
   the tip contacts the opening-perimeter surface, and
   with the door in a position to cover and seal the opening, the sealing segment is compressed between the heel and the tip.

16. The method of claim 15, comprising:
   pressing the tip against the opening-perimeter surface to compress the sealing segment, wherein the tip contacts and moves along the opening-perimeter surface by a distance of less than 1 mm.

17. The method of claim 10, wherein the sealed opening has a conductance of less than 0.2 liters/s/atmosphere.

18. The method of claim 10, wherein the gasket comprises thermoplastic elastomer having a Shore A hardness of from 50 to 80 durometer.

19. The method of claim 10, wherein the gasket has a sealing force in a range from 15 to 20 pounds force.

\* \* \* \* \*